United States Patent [19]

Yun

[11] Patent Number: 5,184,084
[45] Date of Patent: Feb. 2, 1993

[54] DOUBLE BAND FREQUENCY CONVERTING SYSTEM

[75] Inventor: Ki-ho Yun, Suwon, Rep. of Korea

[73] Assignee: Samsung Electronics Co., Ltd., Kyunggi, Rep. of Korea

[21] Appl. No.: 736,923

[22] Filed: Jul. 29, 1991

[30] Foreign Application Priority Data

Jul. 28, 1990 [KR] Rep. of Korea .................... 90-11558

[51] Int. Cl.⁵ .......................... H04B 1/26; H04B 15/00
[52] U.S. Cl. ...................................... 328/15; 307/271; 455/190.1; 455/313
[58] Field of Search ...................... 328/14, 15; 455/188, 455/189, 190, 313-315; 307/271, 529

[56] References Cited

U.S. PATENT DOCUMENTS

| | | | |
|---|---|---|---|
| 3,961,264 | 6/1976 | Hekimian et al. | 455/313 |
| 4,132,952 | 1/1979 | Honga et al. | 455/188 |
| 4,385,402 | 5/1983 | Barrs | 455/314 |
| 4,509,198 | 4/1985 | Nagatomi | 455/190 |

Primary Examiner—Timothy P. Callahan
Attorney, Agent, or Firm—Rothwell, Figg, Ernst & Kurz

[57] ABSTRACT

A double band frequency converter for converting high frequency signals of the microwave radio band to a lower band for a microwave radio band frequency receiver having a wave guide and a low noise amplifier for low-noise amplifying the high frequency signals at the higher microwave frequency band supplied through the wave guide. The double band frequency converter comprises a first frequency converter for converting frequency of the output of the low-noise amplifier, a second frequency converter for frequency-converting the output of the first frequency converter, and an IF amplifier for selectively amplifying the outputs of the first frequency converter or the second frequency converter and an intermediate frequency selection circuit for selecting an output of the first frequency converter or the second frequency converter and supplying it to the IF amplifier. As a result, the second frequency converter operates at the frequency band lower than that of the first frequency converter, facilitating designing and manufacturing works to reduce production cost.

4 Claims, 2 Drawing Sheets

DOUBLE BAND FREQUENCY CONVERTING SYSTEM

BACKGROUND OF THE INVENTION

This invention generally relates to a frequency converting system and, more particularly, to a double band frequency converting system in a microwave radio transmission system which converts high frequency signals of the microwave band to lower frequency bands.

Generally, the term microwave represents waves having wavelengths measured in centimeter units of which the frequency band usually covers the range of from 300 MHz to 30 GHz and the microwave radio communication system signifies a communication system utilizing microwaves propagated in the atmosphere.

Among the components constituting a microwave radio receiver of the above mentioned microwave radio communications system, the frequency converting system is an apparatus that converts the 3~30 GHz microwaves received by the receiver to more easily demodulatable frequencies of 300 MHz~3 GHz, i.e., the ultra high frequency wave band or the very high frequency wave band of 50 MHz~300 MHz and even lower frequencies.

A double band frequency converting apparatus is generally an apparatus which converts transmitted microwaves of two different frequencies propagated from a microwave frequency oscillator of two different radio frequencies to a lower frequency band, as described hereunder in detail with reference to FIG. 1.

FIG. 1 shows the circuit diagram of a frequency converter which converts high frequency signals of the microwave band propagated from two satellites orbiting over Europe, i.e., the ECS (European Communication Satellite) of 10.95~11.7 GHz and Telecom-1 of 12.5~12.75 GHz.

In FIG. 1, a low noise amplifier 20 low-noise amplifies the high frequency signal supplied through a wave guide 10.

A first frequency converting section 30 has a first filter 31 for filtering out high frequency signals of the 10.95~11.7 GHz band from outputs of the low noise amplifier 20, a first local oscillator 33 for generating a locally oscillated frequency of around 10 GHz and a first mixer 32 for mixing both outputs of the first filter 31 and the first local oscillator 33 to generate an intermediate frequency of 1~1.75 GHz.

A second frequency converting section 80 also has a second filter 81 for filtering out high frequency signals of the 12.5~12.75 GHz band from outputs of the low noise amplifier 20, a second local oscillator 83 for generating a locally oscillated frequency of around 11.5 GHz, and a second mixer 82 for mixing both outputs of the second filter 81 and the second local oscillator 83 to generate intermediate frequency of 1~1.25 GHz.

An intermediate frequency amplifier 21 (referred to as IF amplifier) amplifies the output of the first frequency converting section 30 or the second frequency converting section 80 which is selectively supplied by a first switch SW1, and then supplies the amplified frequency to an indoor TV receiver (not shown) via signal/power transit section 60 and cable connection terminal 40. The frequency converting system connected to the outdoor antenna, that is, the wave guide 10, is connected to the tuner of the indoor TV receiver (not shown) through the cable connection terminal 40.

A power supply converting section 50 comprises a first voltage transformer 51, a second voltage transformer 52 and a third voltage transformer 53, wherein the first voltage transformer 51 transforms DC voltage supplied through both the cable connection terminal 40 and the signal/power transit section 60 to thereafter supply it to the low noise amplifier 20, and the second one 52 transforms the DC voltage to thereafter supply it to the first local oscillator 33 or to the second local oscillator 83 while the third voltage transformer 53 transforms the DC voltage to thereafter supply it to the IF amplifier 21.

A signal/power transit section 60 includes a capacitor 61 which is connected between the IF amplifier 21 and the cable connection terminal 40, and a radio frequency choke coil (hereinafter, referred to as a RF choke coil) 62 which is connected between cable connection terminal 40 and the power supply converting section 50.

An intermediate frequency selection section 70 includes a first switch SW1 which selectively switches on the output of the first mixer 32 or the output of the second mixer 82 to the IF amplifier 21, a second switch SW2 which selectively switches on the output of the second voltage transformer 52 to the first local oscillator 33 or the second local oscillator 83 and a switching controller 71 which controls the first and second switch SW1, SW2 according to the electric potential of the output voltage of the RF choke coil 62.

For converting high frequency signals of two microwave bands to lower frequency bands, the conventional double band frequency converter structured as above, however, add technical problems to the manufacturer who must design two local oscillators which generate two locally oscillated high frequencies slightly different from each other, and two mixers which operate in a high frequency band.

Accordingly, it is an object of this invention to provide a double band frequency converter which minimizes the technical difficulties and can reduce production cost in manufacturing a microwave radio receiver.

In order to accomplish the object of the present invention, a microwave receiver having a wave guide and a low noise amplifier for low-noise amplifying the high frequency signals from two distinct microwave bands received through wave guide comprises according to this invention:

a first frequency converter for converting frequency of the output of the low noise amplifier;

a second frequency converter for converting frequency of the output of the first frequency converter again;

an intermediate frequency amplifier for amplifying the output of the first frequency converter or the second frequency converter as selected; and an intermediate frequency selector for transmitting the user selected output of either the first or second frequency converter to the intermediate frequency amplifier, whereby the second frequency converter operates in a frequency band that is lower than that for the operation of the first frequency converter.

BRIEF DESCRIPTION OF THE DRAWINGS

These and other advantages of the present invention will be more apparent by describing a preferred embodiment of the invention with reference to the attached drawings, in which.

DETAILED DESCRIPTION OF THE PREFERRED EMBODIMENT

Figure 2:
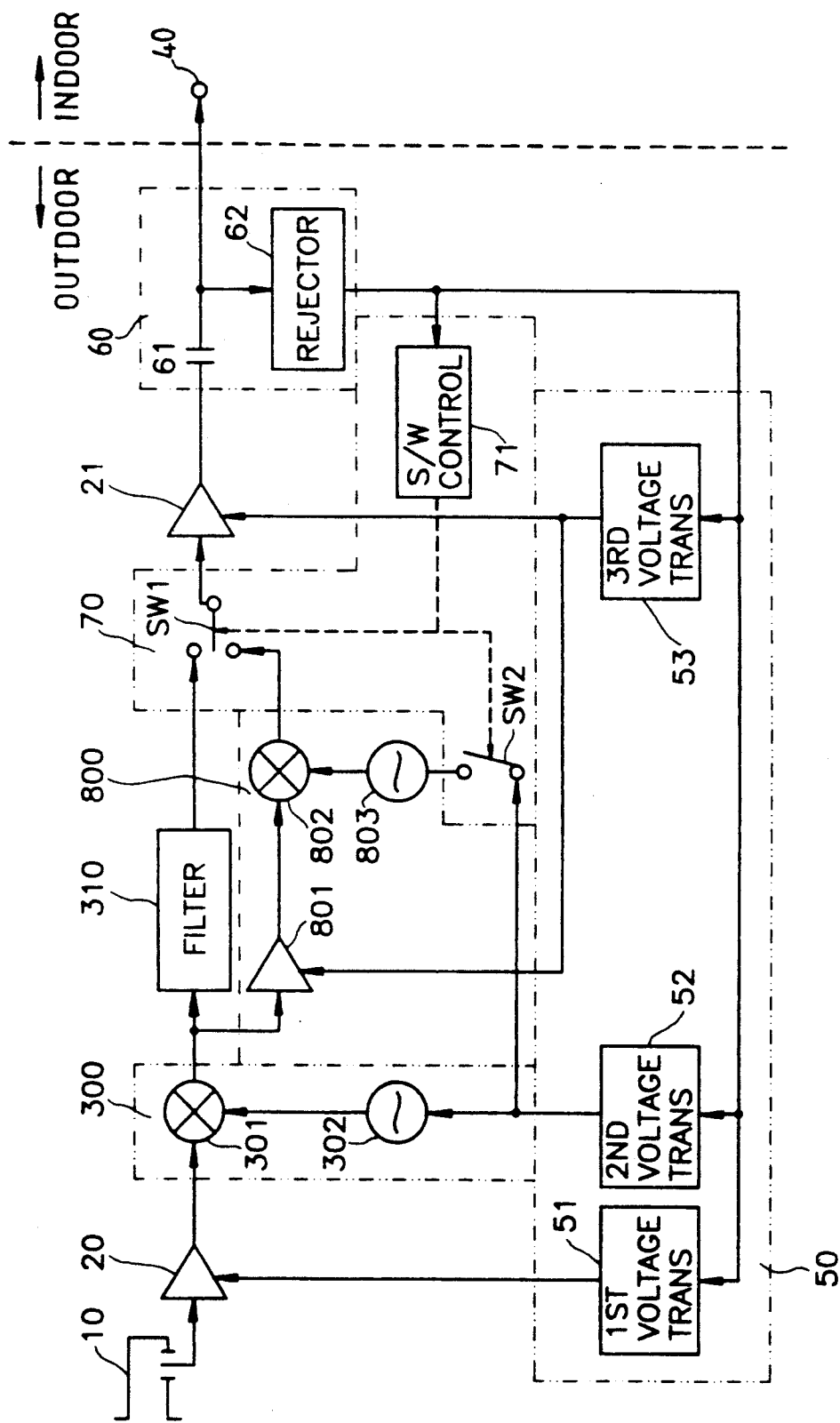
FIG. 2 is a circuit diagram of a double band frequency converting system according to this invention.

A preferred embodiment of the double band frequency converter according to this invention shown in FIG. 2 is to convert frequencies of the high frequency microwave band within the range of 10.95 to 11.7 GHz that are propagated from the European Communications satellite and frequencies within the range of 12.5~12.75 GHz propagated from Telecom 1 satellite which are both currently operated over Europe.

Referring to FIG. 2, a low noise amplifier 20 low-noise amplifies high frequency signals received through the wave guide 10.

A first frequency converting section 300 has a first local oscillator 302 for generating a locally oscillated frequency of around 10 GHz and a first mixer 301 for mixing both of the outputs of low noise amplifier 20 and first local oscillator 302 to generate a first intermediate frequency range of signals.

A second frequency converting section 800 comprises a narrow-band amplifier 801 for band-passing and amplifying only the 2.5~2.7 GHz frequency range component from the first intermediate frequency range of signals, a second local oscillator 803 for generating a locally oscillated frequency of around 3.75 GHz and a second mixer 802 for mixing both of the outputs of the narrow-band amplifier 801 and the second local oscillator 803 to generate a second intermediate frequency range of signal.

An IF amplifier 21 amplifies the selected output from the outputs of the first frequency converting means 300 and the second frequency converting means 800 and outputs the amplified frequency to the indoor TV receiver (not shown) through a cable connection terminal 40.

The power supply converting section 50 comprises a first, a second and a third voltage transformer 51~53 each of which transforms a DC voltage received via the cable connection terminal 40 and the signal/power transit section 60 into respective predetermined voltages and then transfers the transformed voltage to the low-noise amplifier 20, the first local oscillator 302 and the second local oscillator 803, the IF amplifier 21 and the narrow band amplifier 801 respectively.

A filter 310 connected between the first frequency converting means 300 and the IF amplifier 21 band-passes the component of the 1~1.7 GHz frequency band from the output of the first frequency converting means 300 and transmits the band-passed component to IF amplifier 21.

The operation of the double band converting means according to this invention is described hereunder in detail with reference to FIG. 2.

Figure 1:
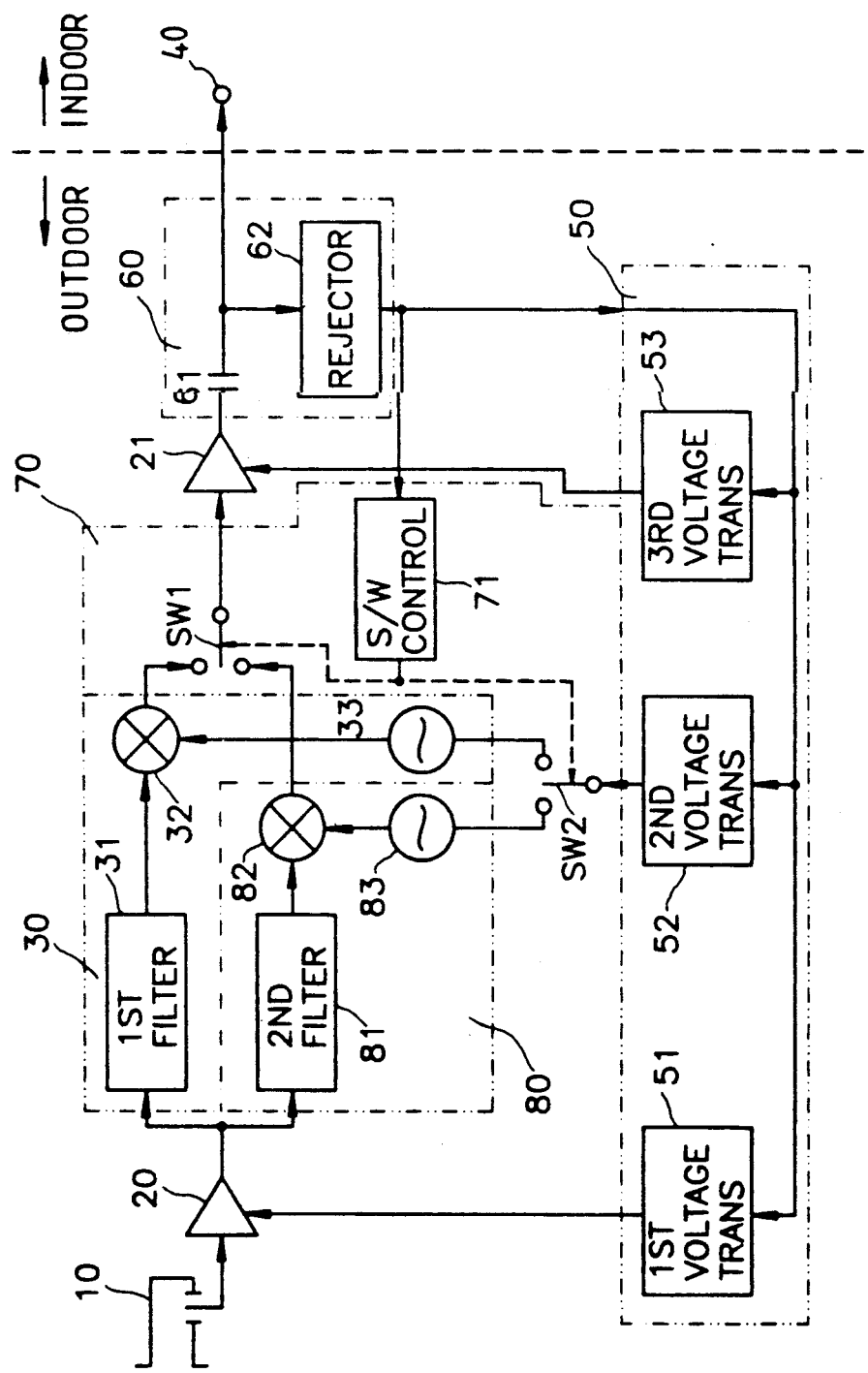
FIG. 1 is a circuit diagram of the conventional double band frequency converter.

The detailed description of a signal/power transit section 60 and an intermediate frequency selection section 70 is omitted here as they are the same circuits as those shown in FIG. 1.

To the output terminal 40 is applied the DC power supply voltage from the indoor TV receiver not shown in the drawings, which is about 15 V for the ECS and about 18 V for Telecom 1 as selected.

If a user selects a desired satellite to be received in the indoor TV receiver (not shown), the signal/power transit section 60 receives the DC voltage, for example, 15 V or 18 V, determined by the selection of the satellite through the cable connection terminal 40. This DC voltage does not pass through the capacitor 61, and is supplied to the switch controller 71, and the first, second and third voltage transformers 51~53 through the RF choke coil 62. On the other hand, the signal/power transit section 60 receives the output of the intermediate frequency amplifier 21. The output of the intermediate frequency amplifier 21 is supplied to the cable connection terminal 40 through the capacitor 61, and is cut off in the TF choke coil 62. Here, the capacitor 61 is a capacitor having a characteristic which is cutting off the DC signal, and the RF choke coil 62 is a coil having a characteristic which is cutting off the AC signal.

The power supply converting section 50 converts the electric potential of the DC voltage supplied through the signal/power transit section 60 and then the resultant voltage is supplied to the low-noise amplifier 20, the IF amplifier 21, the narrow band amplifier 801 and the first and second local oscillators 302, 803, wherein the first voltage transformer 51 supplies operating voltage to the low noise amplifier 20, the second voltage transformer 52 supplies operating voltage to the first and the second local oscillators 302, 803 and the third voltage transformer 53 supplies operating voltages to the IF amplifier 21 and the narrow band amplifier 801 respectively.

The intermediate frequency selection section 70 connects the IF amplifier 21 to the filter 310 or the second mixer 802 of the second frequency converting section 800 according to the potential of the DC power supply voltage supplied by RF choke coil 62 and switches the output of the second voltage transformer 52 to the second local oscillator 803.

Details of the operation of this intermediate frequency switching section 70 are as follows. The switch controller 71 controls the first switch SW1 to connect the filter 310 with the IF amplifier 21 when the output of the RF choke coil 62 is 15 V (that is, when the ECS is selected) and simultaneously controls the second switch SW2 to be in an off condition so that the output of the second voltage transformer 52 is not supplied to the second local oscillator 803. On the contrary, when the output of the RF choke coil 62 is 18 V (that is, when Telecom −1 is selected) the switch controller 71 controls the first switch SW1 to connect the second mixer 802 to the IF amplifier 21 and simultaneously controls the second switch SW2 to be in an on condition so that the output of the second voltage transformer 52 is supplied to the second local oscillator 803.

The wave guide 10 supplies high frequency signals in the range of 10.95~11.7 GHz to the low noise amplifier 20 when the ECS is selected and 12.5~12.75 GHz when Telecom 1 satellite if selected because the horn antenna used in the atmospheric links receives only the selected high frequency signals transmitted from either the ECS or Telecom 1 as selected. The low noise amplifier 20 low-noise amplifies the high frequency signals supplied through the wave guide 10 by a certain amplification rate and then applies the amplified frequency to the first mixer 301 in the first frequency converting section 300.

The first frequency converting section 300 frequency-converts the output of the low noise amplifier 20 and applies the first intermediate frequency signal to the filter 310 and the narrow band amplifier 801 in the second frequency converting section 800. In more detail, the first local oscillator 302 generates a first locally oscillated pulse of around 10 GHz and the first mixer 301 mixes the output of the low noise amplifier 20 with that of the first local oscillator 302 to generate a first intermediate frequency signal of from 1 to 1.7 GHz when the ECS is selected and 2.5 to 2.75 GHz when Telecom −1 is selected.

The filter 310 band-passes a frequency component in the range of from 1 to 1.7 GHz only from the first intermediate frequency signals supplied from the first mixer 301 and then transfers it to the IF amplifier 21 through the first switch SW1.

When Telecom 1 is selected, the second frequency converting section 800 converts the frequency of the output of the first frequency converting section 300 and supplies the second intermediate frequency signal in the range of 1~1.25 GHz to the IF amplifier 21 through the first switch SW1. In other words, the narrow-band amplifier 801 band-passes and amplifies first intermediate frequency signals only with the range of from 2.5 to 2.75 GHz from the output of the first mixer 301 and, the second local oscillator 803 is operated by an operating voltage supplied from the second voltage transformer 52 through the second switch SW2 to generate the second locally oscillated frequency of about 3.75 GHz. The second mixer 802 supplies the second IF signal of from 1 to 1.25 GHz produced by mixing the outputs of the second local oscillator 803 and narrow band amplifier 801 to the intermediate amplifier 21 through the first switch SW1.

The IF amplifier 21 amplifies the output of the filter 310 or that of the second mixer 802 as selected by the switching operation of the first switch SW1 and provides the amplified output to the indoor TV receiver through the condenser 61 of the signal/power transit section 60 and the cable connection terminal 40.

As described above, this invention has the advantage of mitigating technical difficulty in design by reducing the oscillating frequency of the first local oscillator and lowering the operational frequency band of the second mixer through a series of mixers and still another advantage of reducing possible wave interference by enabling the narrow band amplifier and the filter to separate frequencies at lower bands.

What is claimed is:

1. A double band frequency converting system in a microwave radio receiver system having wave guide means for supplying a high frequency signal in a microwave frequency range at an output thereof, comprising:
   first frequency converting means for changing the carrier frequency of said high frequency signal from a first value to a second lower value and outputting the changed high frequency signal at an output thereof;
   second frequency converting means for changing the carrier frequency of the signal outputted by said first frequency converting means form said second lower value to a third value lower than said second lower value and outputting the resultant signal at an output thereof;
   selection means for selecting one of the outputs of said first and second frequency converting means in response to a control signal; and
   an intermediate frequency amplifier for amplifying the output selected by said selection means and transmitting the amplified output to a receiver.

2. A double band frequency converting system according to claim 1, wherein said wave guide means comprises a wave guide and a low noise amplifier connected to an output of said wave guide.

3. A double band frequency converting system according to claim 2, wherein said first frequency converting means comprises:
   a first local oscillator for generating a locally oscillated frequency of about 10 GHz; and
   a first mixer for mixing the output of said low noise amplifier with that of the first local oscillator and then producing a first intermediate frequency signal at said output thereof.

4. A double band frequency converting system according to claim 3, wherein said second frequency converting means comprises:
   a narrow band amplifier for band-passing and amplifying a frequency component of from 2.5 to 2.75 GHz from said first intermediate frequency signal;
   a second local oscillator for producing a locally oscillated frequency of about 3.75 GHz, and
   a second mixer for mixing the output of said narrow band amplifier with that of said local oscillator and producing a second intermediate frequency signal at said output thereof.

* * * * *

UNITED STATES PATENT AND TRADEMARK OFFICE
CERTIFICATE OF CORRECTION

PATENT NO. : 5,184,084

DATED : February 2, 1993

INVENTOR(S) : Ki-ho Yun

It is certified that error appears in the above-identified patent and that said Letters Patent is hereby corrected as shown below:

Col. 4, line 12, "TF" should be --RF--.

Col. 6, line 12, "form" should be --from--.

Signed and Sealed this

Twenty-seventh Day of December, 1994

Attest:

BRUCE LEHMAN

Attesting Officer

Commissioner of Patents and Trademarks